US009679953B2

(12) United States Patent
Fang et al.

(10) Patent No.: US 9,679,953 B2
(45) Date of Patent: Jun. 13, 2017

(54) WOLED BACK PANEL AND METHOD OF MANUFACTURING THE SAME

(71) Applicant: BOE Technology Group Co., Ltd., Beijing (CN)

(72) Inventors: Jingfei Fang, Beijing (CN); Chunsheng Jiang, Beijing (CN); Yanzhao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 126 days.

(21) Appl. No.: 14/435,895

(22) PCT Filed: Aug. 13, 2014

(86) PCT No.: PCT/CN2014/084245
§ 371 (c)(1),
(2) Date: Apr. 15, 2015

(87) PCT Pub. No.: WO2015/149465
PCT Pub. Date: Oct. 8, 2015

(65) Prior Publication Data
US 2016/0260788 A1 Sep. 8, 2016

(30) Foreign Application Priority Data
Mar. 31, 2014 (CN) .......................... 2014 1 0126074

(51) Int. Cl.
*H01L 27/32* (2006.01)
*H01L 27/12* (2006.01)
(Continued)

(52) U.S. Cl.
CPC ........ *H01L 27/3248* (2013.01); *H01L 27/322* (2013.01); *H01L 27/3258* (2013.01);
(Continued)

(58) Field of Classification Search
CPC .................. H01L 27/1288; H01L 51/0022
See application file for complete search history.

(56) References Cited

U.S. PATENT DOCUMENTS 5,597,890 A * 1/1997 Jenekhe ................. C08G 61/00
524/417
2004/0211960 A1 10/2004 Joo et al.
(Continued)

FOREIGN PATENT DOCUMENTS

| CN | 1470927 A | 1/2004 |
|---|---|---|
| CN | 1941384 A | 4/2007 |

(Continued)

OTHER PUBLICATIONS

Jenekhe, S. A. and Tibbetts, S. J. Ion implantation doping and electrical properties of high-temperature ladder polymers. J. Polym. Sci. Polym. Phys. 26 (1988) 201-209.*
(Continued)

*Primary Examiner* — Lex Malsawma
*Assistant Examiner* — Gardner W Swan
(74) *Attorney, Agent, or Firm* — Westman, Champlin & Koehler, P.A.

(57) ABSTRACT

The present invention discloses a WOLED back panel and a method of manufacturing the same. The method comprises: forming a pattern of a color filter layer on a substrate; exposing the pattern of the color filter layer by halftone exposure so as to form a groove structure in the pattern of the color filter layer; forming a pattern of a resin material layer on a surface of the substrate formed with the groove structure, and heavily doping a partial region of the resin material layer so as to form a heavily doped part having a conductivity; the heavily doped partial region of the resin material layer corresponding to a pixel electrode region, a via region, and a connection region between the pixel electrode region and the via region; and forming an organic (Continued)

light-emitting layer and a cathode in order on a surface of the substrate after heavily doping the partial region of the resin material layer. The production cost is reduced in the present invention by forming a groove structure in the color filter layer instead of manufacturing a conventional pixel defining layer.

16 Claims, 7 Drawing Sheets

(51) Int. Cl.
  *H01L 51/52* (2006.01)
  *H01L 51/56* (2006.01)
(52) U.S. Cl.
  CPC ...... *H01L 27/1288* (2013.01); *H01L 51/5206* (2013.01); *H01L 51/56* (2013.01); *H01L 2227/323* (2013.01)

(56) References Cited

U.S. PATENT DOCUMENTS

| | | | |
|---|---|---|---|
| 2005/0045885 A1 | 3/2005 | Kim et al. | |
| 2007/0048633 A1 | 3/2007 | Hsu et al. | |
| 2007/0238218 A1* | 10/2007 | Teng | H01L 27/322 438/99 |
| 2007/0247565 A1* | 10/2007 | Sasaki | C09B 67/0022 349/70 |
| 2009/0200931 A1* | 8/2009 | Takei | H01L 27/3246 313/504 |
| 2012/0181553 A1* | 7/2012 | Ono | H01L 27/3246 257/88 |

FOREIGN PATENT DOCUMENTS

| | | |
|---|---|---|
| CN | 101060130 A | 10/2007 |
| CN | 102739849 A | 10/2012 |
| CN | 102866843 A | 1/2013 |
| CN | 103151359 A | 6/2013 |
| CN | 103454812 A | 12/2013 |
| CN | 103500731 A | 1/2014 |
| CN | 103915580 A | 7/2014 |
| TW | 200740283 A | 10/2007 |

OTHER PUBLICATIONS

Popok, V. N. Ion implantation of polymers: formation of nanoparticulate materials. Rev. Adv. Mater. Sci. 30 (2012) 1-26.*
International Search Report and Written Opinion for PCT Application No. PCT/CN2014/084245, dated Jan. 9, 2015, 10 pages.
English translation of Box No. V of the Written Opinion for the International Searching Authority for International Application No. PCT/CN2014/084245 which was dated Jan. 9, 2015, 3 pages.
First Office Action for Chinese Patent Application No. 201410272754.2, dated Sep. 2, 2015, 9 pages.

* cited by examiner

WOLED BACK PANEL AND METHOD OF MANUFACTURING THE SAME

CROSS-REFERENCE TO RELATED APPLICATION

This Application is a Section 371 National Stage Application of International Application No. PCT/CN2014/084245, filed Aug. 13, 2014, which has not yet published, which claims priority to Chinese Patent Application No. 201410126074.X, filed Mar. 31, 2014, in Chinese, the contents of which are hereby incorporated by reference in their entirety.

BACKGROUND OF THE INVENTION

Field of the Invention

The present invention relates to the field of image display technologies, and particularly, to a WOLED back panel and a method of manufacturing the same.

Description of the Related Art

In the display technologies using an organic light-emitting diode (OLED) having a self-luminous characteristic, a very thin coating of organic material and a glass substrate are used, and the organic material will luminesce when a current passes therethough. The OLED has many advantages such as active luminescence, a high luminous efficiency, a fast response time (in order of 1 μs), a low operating voltage (3~10V), a wide angle of view (>170°), a small panel thickness (<2 mm), a low power consumption, a broad range of operating temperature (−4° C.~85° C.), a flexible display and the like, and thus has been known as the third generation display technology after CRT and LCD. The OLED may be made by many production processes such as small molecular evaporation, polymer spin coating, ink jet printing, large area printing or the like, and be suitable for mass production with low production costs, and thus may compete with a fluorescent lamp in the long run. A white organic light-emitting diode (WOLED) is of a surface light source, may be made into a flat light source having a large area and any shape when compared to a point source of LED, and thus is more suitable to a backlight source of a liquid crystal display and a full color OLED display. Because of a huge potential of the WOLED in flat panel lighting applications, the WOLED has become a hot research topic in the 10 years, and is expected to play a main role in new semiconductor lighting technologies, like the LED.

A basic arrangement of the OLED is a structure like a sandwich, formed by a thin and transparent layer of indium tin oxide (ITO) having semiconductor properties and connected with an anode of a power supply, and a metal cathode. The whole arrangement comprises a hole transmission layer (HTL), a light emitting layer (EL) and an electron transmission layer (ETL). When applied with suitable voltages by the power supply, positive holes and negative charges will combine within the light emitting layer to produce the light, and thus three-primary colors including red R, green G and Blue B may be produced depending on different compositions, so as to constitute basic colors. The OLED is characterized, firstly, in self-luminescence and needing no backlight compared to TFT LCD, and thus is high in visibility and brightness. Secondly, the OLED requires a low voltage and has a high energy-saving efficiency, a fast response, a light weight, a thin thickness, a simple configuration, a low cost and the like, and thus is regarded as one of the most promising products in the 21st Century.

FIG. 1 (a) is a schematic appearance diagram of a typical bottom-gate and bottom-emitting type WOLED back panel in the prior art. As shown in Fig. (a), the WOLED back panel comprises a plurality of sub-pixel units arranged in an array, and each sub-pixel unit includes a pixel electrode 101 and a via region 102 for connecting a drain of an underlying thin film transistor (TFT) 110 and an upper pixel electrode 101. FIGS. 1(b)~1(e) show schematic flowcharts of a process of manufacturing the AA' section of the WOLED back panel shown in Fig. (a). The specific process is described as follows.

The process of manufacturing an oxide bottom-gate TFT is similar to a process of manufacturing a-Si. The difference between the two processes is that in the process of manufacturing an oxide bottom-gate TFT, a material for an active layer is changed, and an etching stop layer (ESL) is added after forming the active layer so as to prevent the active layer from being damaged when etching a source/a drain. Thus, the specific process of manufacturing the oxide bottom-gate TFT will not be expanded and described in details, and only a process of manufacturing a color filter array (COA) after depositing a passivation layer is illustrated.

Firstly, after depositing a passivation layer (PVX) 111, color filters 103 are spin-coated in a color filter production line in order of RGB of the sub-pixels, as shown in FIG. 1(b). Since the color filters 103 have a larger thickness, it is required to flatten the color filters 103 by depositing a planarization layer 104, so as to ensure continuity of a subsequent ITO film between the via 102 and the pixel electrode 101, as shown in FIG. 1(c). Then, after exposure and curing processes, an ITO film 105 is deposited and etched, as shown in FIG. 1(d), so that the ITO film is evenly laid above the color filters 103 covered with the planarization layer 104. Thereafter, in order to ensure that light emitted from each sub-pixel will not interfere with the other sub-pixels, pixel defining layers 106 are manufactured among respective sub-pixels, such as DPI000, which have a thickness of 1.5~2 μm, thereby forming a structure shown in FIG. 1(e). The organic light emitting layer of the WOLED back panel may be deposited on pixel electrodes between the pixel defining layers 106 by evaporation or printing, and then a metal cathode material such as Al is deposited, finishing manufacturing the back panel.

It is obvious that the process of manufacturing the WOLED back panel is relatively complicated in the prior art, processes such as gluing, exposing and the like are required to manufacture the pixel defining layer, and a special mask for the pixel defining layer needs to be made, causing a long production cycle and a higher cost.

SUMMARY OF THE INVENTION

Therefore, the present invention provides a WOLED back panel and a method of manufacturing the same, which use a halftone exposure technology to form a particular color filter structure that replaces the function of the pixel defining layer, thereby simplifying manufacturing processes and improving production efficiency.

According to one aspect of the present invention, there is provided a method of manufacturing a WOLED back panel, comprising steps of:

forming a pattern of a color filter layer on a substrate;

exposing the pattern of the color filter layer by halftone exposure so as to form a groove structure in the pattern of the color filter layer;

forming a pattern of a resin material layer on a surface of the substrate formed with the groove structure, and heavily doping a partial region of the resin material layer so as to form a heavily doped part having a conductivity, the heavily doped partial region of the resin material layer corresponding to a pixel electrode region, a via region, and a connection region between the pixel electrode region and the via region; and forming an organic light-emitting layer and a cathode in order on the surface of the substrate after heavily doping the partial region of the resin material layer.

In an embodiment, in the step of exposing the pattern of the color filter layer by halftone exposure so as to form a groove structure in the pattern of the color filter layer, the groove structure is formed in a middle portion of the pattern of the color filter layer.

In an embodiment, the step of exposing the color filter layer by halftone exposure specifically comprises:

performing, through a halftone exposure mask, half-exposure to a portion in which the groove structure is formed, and full exposure to other regions.

In an embodiment, the color filter layer is made of a positive photoresist material.

In an embodiment, the step of heavily doping a partial region of the resin material layer specifically comprises:

performing ion implantation in the partial region of the resin material layer; and performing a curing process on the resin material layer which has been ion-implanted.

In an embodiment, an ion source for the ion implantation includes metal elements, phosphine or borane.

In an embodiment, the color filter layer has a thickness of 4.0~5 μm.

In an embodiment, the thickness of the color filter layer is 4.5 μm.

According to a second aspect of the present invention, there is provided a WOLED back panel, comprising a substrate, a color filter layer, a resin layer, an organic light-emitting layer and a cathode. The color filter layer is located on the substrate and covers respective pixel electrode regions. A pattern of the color filter layer covering each pixel electrode region has a groove structure, and the resin material layer is provided on the color filter layer and has a partial region which is heavily doped to become a conductive region, wherein the partial region corresponding to a pixel electrode region, a via region, and a connection region between the pixel electrode region and the via region. An organic light-emitting layer and a cathode are arranged in order on the resin material layer.

In an embodiment, the groove structure is located in a middle portion of respective patterns of the color filter layer.

In an embodiment, the color filter layer is made of a positive photoresist material.

In an embodiment, the conductive region is formed by performing ion implantation in a partial region of the resin material layer, and an ion source for the ion implantation includes metal elements, phosphine or borane.

With the WOLED back panel and the method of manufacturing the same provided by the present invention, the particular color filter structure is used to replace the function of the pixel defining layer during the manufacturing processes, thereby omitting the step of manufacturing the pixel defining layer, reducing the number of masks for manufacturing the WOLED back panel, simplifying the whole of the manufacturing processes, improving production efficiency and saving production costs.

BRIEF DESCRIPTION OF THE DRAWINGS

FIGS. 1(b)~1(e) show schematic flowcharts of processes of manufacturing the AA' section of the WOLED back panel shown in Fig. (a);

DETAILED DESCRIPTION OF PREFERRED EMBODIMENTS

The present invention will be further described hereinafter in detail in conjunction with preferred embodiments and with reference to the attached drawings, so that purposes, technique solutions and advantages of the present invention become more clear and apparent.

During processes of manufacturing a WOLED back panel in the prior art, it is required to deposit and etch a pixel defining layer after finishing the transparent electrode, in order to prevent interference between sub-pixels; meanwhile, processes such as gluing, exposing and the like are required to manufacture the pixel defining layer, and a special mask for the pixel defining layer needs to be made, which is very complicated, resulting in that the whole process of manufacturing a WOLED back panel is complicated, and production costs and production time are increased.

During processes of manufacturing a WOLED back panel in one embodiment of the present invention, a halftone exposure technology is used to process a color filter layer so as to form a groove structure on the color filter layer, so that a material for an organic light emitting layer is directly evaporated within the groove structure, and that no mutual interference phenomenon occurs between the organic light emitting layers in adjacent sub-pixels, and thus no pixel defining layer is specially required to isolate respective sub-pixels.

Figure 1:
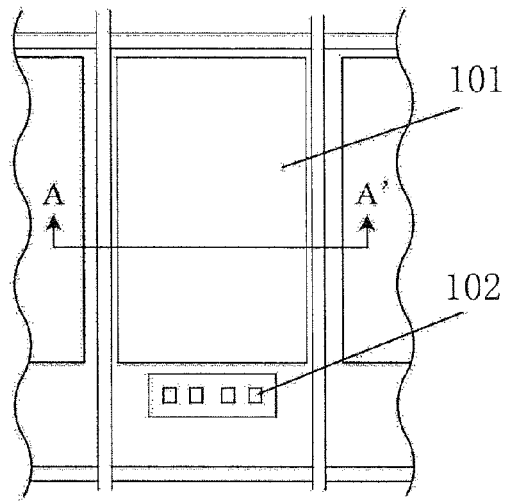
FIG. 1 (a) is a schematic appearance diagram of a typical bottom-gate and bottom-emitting type WOLED back panel in the prior art.
Figure 1:
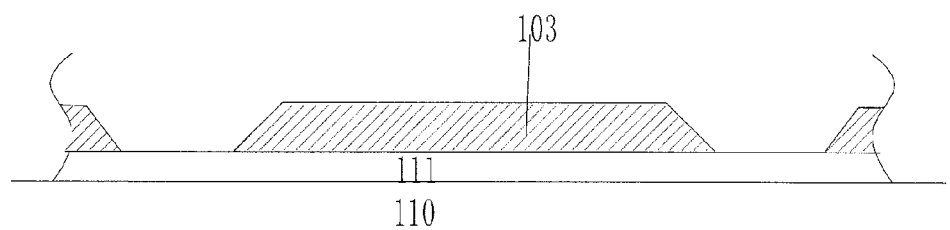
Figure 1:
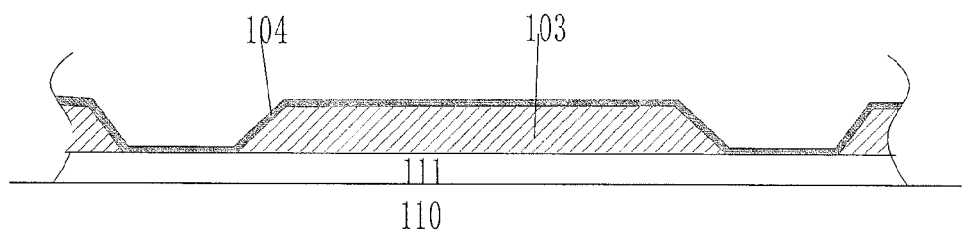
Figure 1:
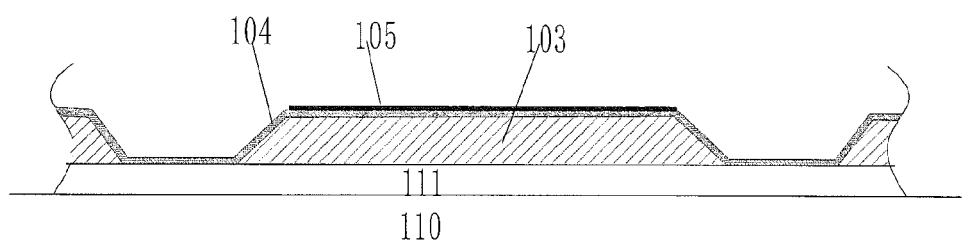
Figure 1:
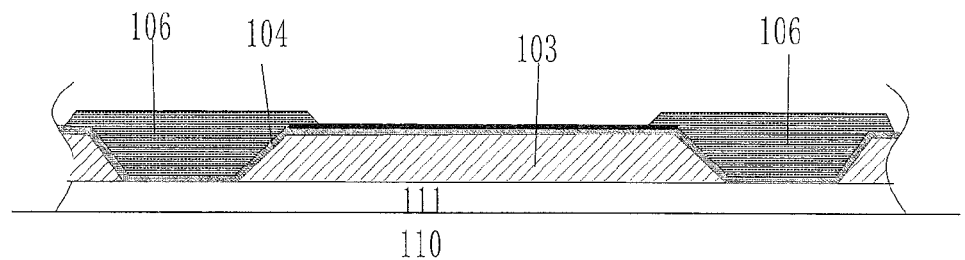
Figure 2:
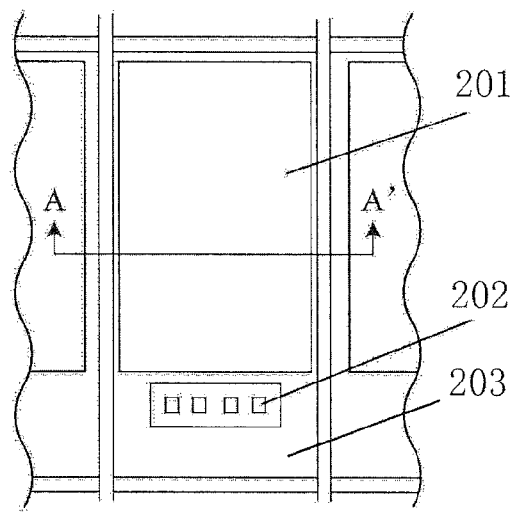
FIG. 2 is a schematic diagram showing an appearance of a substrate in the WOLED back panel in an embodiment of the present invention.

FIG. 2 is a schematic diagram showing an appearance of a substrate in the WOLED back panel in an embodiment of the present invention. As shown in FIG. 2, the substrate has a plurality of sub-pixel regions arranged in an array, and an insulation region between every two sub-pixel regions. Each sub-pixel region comprises a pixel electrode region 201, a via region 202, and a connection region 203 connecting the pixel electrode region 201 and the via region 202. The via region 202 has a plurality of vias located above a drain of an underlying thin film transistor and configured to connect the drain of the underlying thin film transistor and the pixel electrodes.

Figure 3:
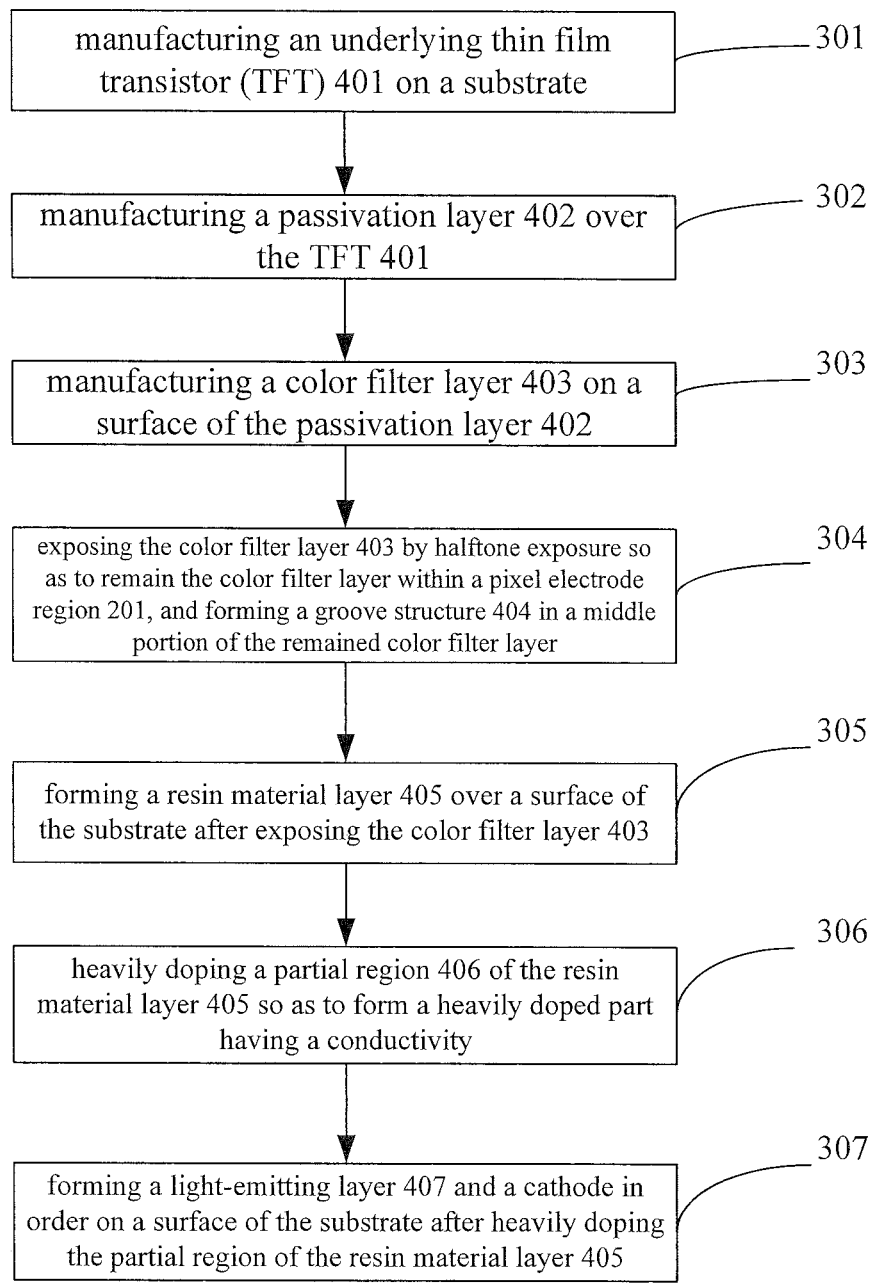
FIG. 3 shows a flowchart of a method of manufacturing a WOLED back panel in an embodiment of the present invention.

FIG. 3 shows a flowchart of a method of manufacturing a WOLED back panel in an embodiment of the present invention. FIGS. 4(a)~4(d) show schematic diagrams of processes of manufacturing a WOLED back panel in an embodiment of the present invention. As shown in FIG. 3 and FIGS. 4(a)~4(d), the method comprises:

step 301: manufacturing an underlying thin film transistor (TFT) 401 on a substrate (not shown in the figures).

Optionally, the substrate may be made of a material such as glass, quartz, transparent resin or the like.

Figure 4:
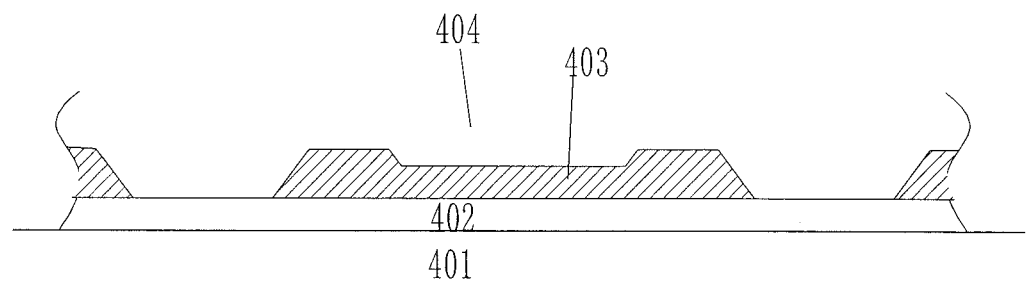
FIG. 4(a)~4(d) show schematic diagrams of processes of manufacturing a WOLED back panel in an embodiment of the present invention.
Figure 4:
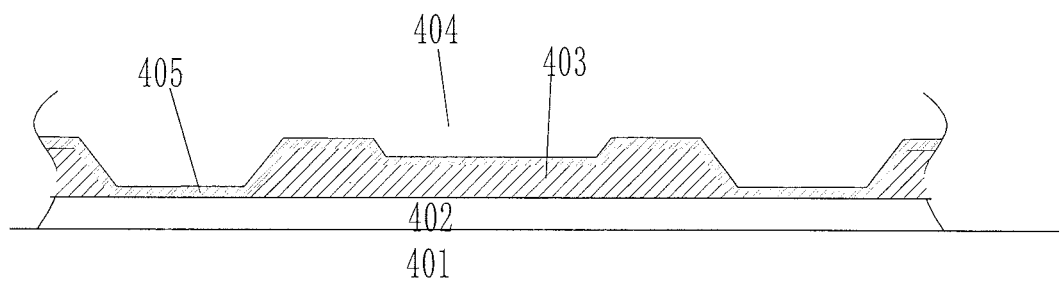
Figure 4:
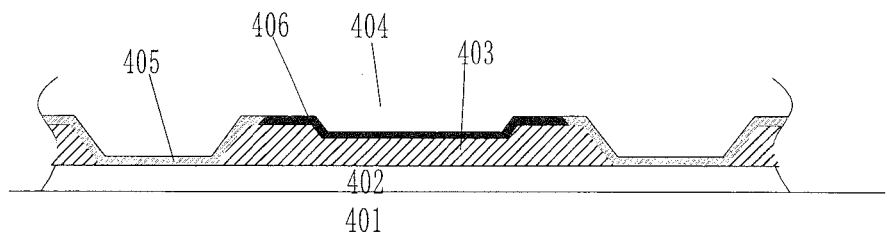
Figure 4:
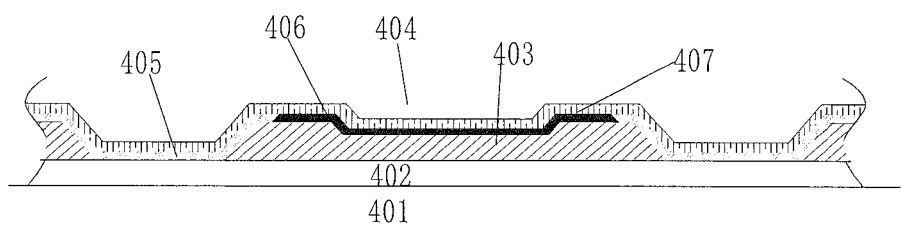

Optionally, processes of manufacturing the TFT comprise depositing in order and respectively etching a gate, a gate insulation layer, an active layer, an etching stop layer, a source and a drain so as to form the TFT. Since the processes of manufacturing the TFT are not emphases to be described in the present invention, and may be achieved in a conventional way in the prior art, the processes of manufacturing the TFT are not limited herein.

step 302: manufacturing a passivation layer 402 over the TFT 401, as shown in FIG. 4(*a*). The passivation layer 402 is an insulation layer for isolating the TFT and a pixel electrode to be manufactured thereon from interfering with each other.

Optionally, silicon oxide, silicon nitride or a combination thereof may be used as a material for the passivation layer.

step 303: manufacturing a color filter layer 403 on a surface of the passivation layer 402, as shown in FIG. 4(*a*). The color filter layer 403 is made of positive photoresist, which has a thickness greater than a conventional thickness by 1.5~2 μm. The positive photoresist must be used because it is required to perform half-exposure on the color filter layer 403 in subsequent processes.

Optionally, the thickness of the color filter layer 403 is 4.0~5 μm, and preferably, is 4.5 μm.

step 304: exposing the color filter layer 403 by halftone exposure so as to remain the color filter layer within a pixel electrode region 201, and forming a groove structure 404 in a middle portion of the remained color filter layer. Since the thickness of the color filter layer 403 is larger, the exposure operation is easily applied to the color filter layer. The groove structure 404 is located within the middle portion of the pixel electrode region 201, and has raised peripheral edges so that after subsequently evaporating a luminescent material to form a light emitting layer, only the luminescent material within the groove is remained, as shown in FIG. 4(*a*).

step 305: forming a resin material layer 405 over a surface of the substrate after exposing the color filter layer 403, as shown in FIG. 4(*b*).

Optionally, the resin material layer 405 is formed by spin coating.

step 306: heavily doping a partial region 406 of the resin material layer 405 so as to form a heavily doped part having a conductivity, as shown in FIG. 4(*c*). The partial region 406 comprises a pixel electrode region 201, a via region 202, and a connection region between the pixel electrode region 201 and the via region 202. The via region 202 has a via located above the drain of the TFT and configured to connect a pixel electrode and the drain of the TFT.

The resin material layer 405 plays important roles in several aspects: firstly, it may be used as a planarization layer to flatten the color filter layer 404; secondly, since the heavily doped partial region 406 in the resin material layer 405 is electrically conductive, the pixel electrode region can be electrically connected to the drain of the TFT through the via region; thirdly, since other regions of the resin material layer 405, except for the partial region 406, are not heavily doped, are located in adjacent sub-pixel units and has no conductivity, the other regions can function as a pixel defining layer for isolating adjacent sub-pixel units, and can cooperate with gate lines and data lines to ensure that light emitted from sub-pixel unit will not interfere with other sub-pixel units; fourthly, after forming the light emitting layer and a cathode so as to form a complete pixel electrode, the heavily doped partial region of the resin material layer 405 is used as an anode of the pixel electrode, thereby omitting processes of manufacturing a ITO film.

step 307: forming a light-emitting layer 407 and a cathode (not shown in the figures) in order on a surface of the substrate after heavily doping the partial region of the resin material layer 405, as shown in FIG. 4(*d*). The heavily doped partial region 406 of the resin material layer 405 is used as an anode of the pixel electrode.

Figure 5:
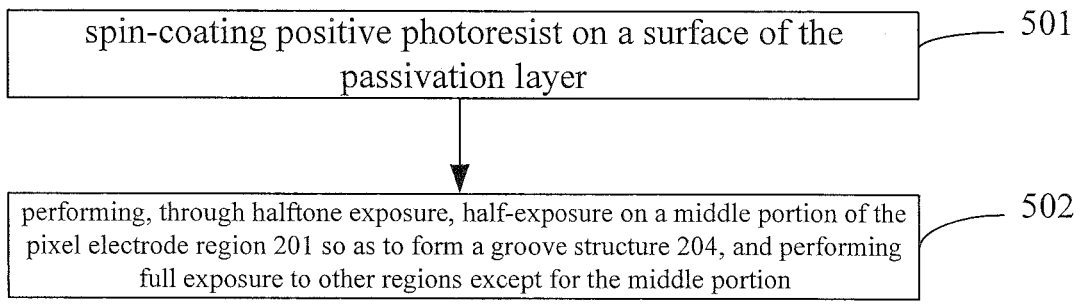
FIG. 5 shows a flowchart of a method of manufacturing a groove structure within a partial region of a color filter layer by using a halftone exposure technology in an embodiment of the present invention.

FIG. 5 shows a flowchart of a method of manufacturing a groove structure within the partial region of the color filter layer by using a halftone exposure technology in an embodiment of the present invention. As shown in FIG. 5, the method specifically comprises steps of:

step 501, spin coating positive photoresist on a surface of the passivation layer;

step 502, performing, through halftone exposure, half exposure to a middle portion of the pixel electrode region 201 so as to form a groove structure 204, and full exposure to other regions except for the middle portion.

In an embodiment, the half-exposed region has a thickness of about 1.5~2 μm.

Figure 6:
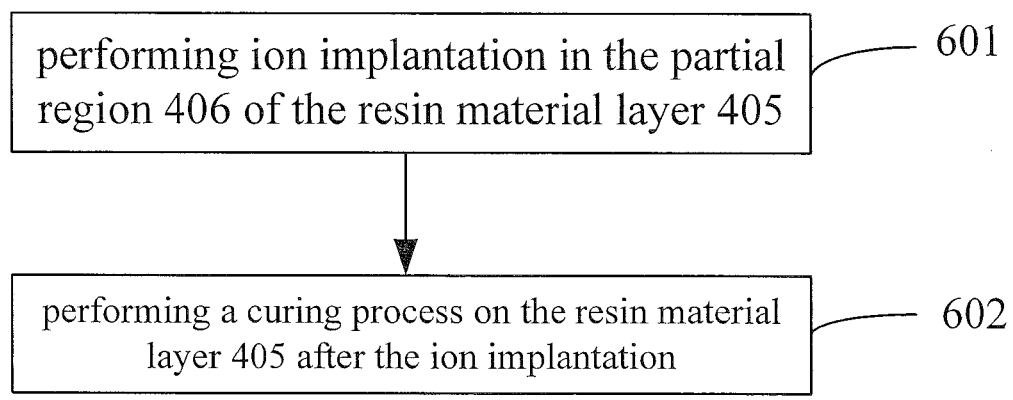
FIG. 6 shows a flowchart of a method of heavily doping the partial region of the color filter layer according to the present invention.

FIG. 6 shows a flowchart of a method of heavily doping the partial region of the color filter layer according to the present invention. The method specifically comprises steps of:

step 601, performing ion implantation in the partial region 406 of the resin material layer 405; and step 602, performing a curing process on the resin material layer 405 after the ion implantation.

In an embodiment, an ion source for the ion implantation includes metal elements, phosphine or borane.

As can be seen from the description of the WOLED back panel and the method of manufacturing the same in the above embodiments, the thickness of the color filter layer of the WOLED back panel can be larger. Thus, in the present invention, the color filter layer is processed through the halftone exposure so as to form the groove structure, and then the resin material layer is deposited on the color filter layer, and the partial region of the resin material layer is heavily doped so that the partial region is conductive and can be used as the anode, while other regions of the resin material layer which are not heavily doped are not conductive and thus can be used as a pixel defining layer. In this way, not only processes of manufacturing a ITO film are omitted, but also processes of manufacturing the pixel defining layer are omitted, thereby saving materials and costs. Further, a discharging phenomenon will occur at an edge of a transparent electrode during use of the OLED back panel in the prior art, causing damage of devices on the back panel, while in the present invention, the resin material layer is a complete layer structure, thereby avoiding the discharging phenomenon at the edges of the pixel electrode.

The present invention provides a WOLED back panel, which can be made in the above embodiments. The WOLED back panel comprises a substrate, a color filter layer, a resin layer, an organic light-emitting layer and a cathode. The color filter layer is located on the substrate and covers respective pixel electrode regions, wherein a pattern of the color filter layer covering each pixel electrode region has a groove structure, and the resin material layer is provided on the color filter layer and has a partial region that is heavily doped to become a conductive region. The partial region corresponds to a pixel electrode region, a via region, and a connection region between the pixel electrode region and the via region, and an organic light-emitting layer and a cathode are arranged in order on the resin material layer.

The substrate may be a glass substrate, on which an array of thin film transistors may be manufactured.

The WOLED back panel provided in the present invention is manufactured by the above methods, and thus details thereof may be obtained from the description of the methods, which are not repeatedly described here.

Purposes, technical solutions and advantageous effects of the present invention have been further illustrated in the above specific embodiments. It should be understood that the above description is merely used to illustrate specific embodiments of the present invention, but not to limit the present invention. All of changes, equivalent alternatives, improvements, made within principles and spirit of the disclosure, should be included within the scope of the present invention.

What is claimed is:

1. A method of manufacturing a white organic light emitting diode (WOLED) back panel, comprising steps of:
    forming a pattern of a color filter layer on a substrate;
    exposing the pattern of the color filter layer by halftone exposure so as to form a groove structure in the pattern of the color filter layer;
    forming a pattern of a resin material layer on a surface of the substrate formed with the groove structure, and heavily doping a partial region of the resin material layer so as to form a heavily doped part having a conductivity, wherein the heavily doped partial region of the resin material layer corresponds to a pixel electrode region, a via region, and a connection region between the pixel electrode region and the via region, and other regions, which are not heavily doped, of the resin material are located in adjacent pixel units and have no conductivity; and
    forming an organic light-emitting layer and a cathode in order on a surface of the substrate after heavily doping the partial region of the resin material layer.

2. The method according to claim 1, wherein in the step of exposing the pattern of the color filter layer by halftone exposure so as to form the groove structure in the pattern of the color filter layer, the groove structure is formed in a middle portion of the pattern of the color filter layer.

3. The method according to claim 1, wherein the step of exposing the color filter layer by halftone exposure comprises:
    performing, through a halftone exposure mask, half exposure on a portion at which the groove structure is formed, and performing full exposure on other regions.

4. The method according to claim 1, wherein the color filter layer is made of a positive photoresist material.

5. The method according to claim 1, wherein the step of heavily doping the partial region of the resin material layer comprises:
    performing ion implantation in the partial region of the resin material layer; and
    performing a curing process on the resin material layer after the ion implantation.

6. The method according to claim 5, wherein an ion source for the ion implantation comprises metal elements, phosphine or borane.

7. The method according to claim 1, wherein the color filter layer has a thickness of 4.0~5.0 μm.

8. The method according to claim 7, wherein the thickness of the color filter layer is 4.5 μm.

9. A white organic light emitting diode (WOLED) back panel, comprising:
    a substrate;
    a color filter layer, located on the substrate and covering respective pixel electrode regions, wherein a pattern of the color filter layer covering each pixel electrode region has a groove structure;
    a resin layer, provided on the color filter layer and having a partial region that is heavily doped to become a conductive region, the partial region corresponding to a pixel electrode region, a via region, and a connection region between the pixel electrode region and the via region, and other regions, which are not heavily doped, of the resin material layer are located in adjacent pixel units and have no conductivity;
    an organic light-emitting layer and a cathode, arranged in order on the resin material layer.

10. The back panel according to claim 9, wherein the groove structure is located in a middle portion of respective patterns of the color filter layer.

11. The back panel according to claim 9, wherein the color filter layer is made of a positive photoresist material.

12. The back panel according to claim 9, wherein the conductive region is formed by performing ion implantation in the partial region of the resin material layer, and an ion source for the ion implantation comprises metal elements, phosphine or borane.

13. The method according to claim 2, wherein the step of heavily doping the partial region of the resin material layer comprises:
    performing ion implantation in the partial region of the resin material layer; and
    performing a curing process on the resin material layer after the ion implantation.

14. The method according to claim 3, wherein the step of heavily doping the partial region of the resin material layer comprises:
    performing ion implantation in the partial region of the resin material layer; and
    performing a curing process on the resin material layer after the ion implantation.

15. The back panel according to claim 10, wherein the color filter layer in made of a positive photoresist material.

16. The back panel according to claim 10, wherein the conductive region is formed by performing ion implantation in the partial region of the resin material layer, and an ion source for the ion implantation comprises metal elements, phosphine or borane.

* * * * *